(12) United States Patent
Park et al.

(10) Patent No.: US 7,220,915 B1
(45) Date of Patent: May 22, 2007

(54) MEMORY CARD AND ITS MANUFACTURING METHOD

(75) Inventors: Chul Woo Park, Kangdong-gu (KR); Sang Jae Jang, Gwangjin-gu (KR); Sung Su Park, Gwangjin-gu (KR); Choon Heung Lee, Gwangju (KR); Suk Gu Ko, Kangdong-gu (KR)

(73) Assignee: Amkor Technology, Inc., Chandler, AZ (US)

( * ) Notice: Subject to any disclaimer, the term of this patent is extended or adjusted under 35 U.S.C. 154(b) by 121 days.

(21) Appl. No.: 11/060,263

(22) Filed: Feb. 17, 2005

(51) Int. Cl.
H05K 3/28 (2006.01)
H01L 23/02 (2006.01)
H01L 23/495 (2006.01)

(52) U.S. Cl. .................... 174/52.2; 257/679; 257/676; 361/757

(58) Field of Classification Search ................ 361/739, 361/750, 757, 784, 736–737; 174/52, 256, 174/258, 52.2; 257/676–680, 787; 438/112, 438/126
See application file for complete search history.

(56) References Cited

U.S. PATENT DOCUMENTS

| 3,668,299 A | 6/1972 | Mc Neal |
| 4,532,419 A | 7/1985 | Takeda |
| 4,905,124 A | 2/1990 | Banjo et al. |
| 4,974,120 A | 11/1990 | Kodai et al. |
| 5,172,214 A | 12/1992 | Casto |
| 5,360,992 A | 11/1994 | Lowrey et al. |
| 5,574,309 A | 11/1996 | Papapietro et al. |
| 5,742,479 A | 4/1998 | Asakura |
| 5,753,532 A | 5/1998 | Sim |
| 5,784,259 A | 7/1998 | Asakura |
| 5,789,280 A | 8/1998 | Yokota |
| 5,808,359 A | 9/1998 | Muto et al. |
| 5,822,190 A | 10/1998 | Iwasaki |
| 5,893,724 A | 4/1999 | Chakravorty et al. |
| 5,977,613 A | 11/1999 | Takata et al. |
| 6,040,622 A | 3/2000 | Wallace |
| 6,053,414 A * | 4/2000 | Stoll et al. .................. 235/492 |

(Continued)

FOREIGN PATENT DOCUMENTS

JP 3112688 5/1991

(Continued)

*Primary Examiner*—Don Wong
*Assistant Examiner*—Hung Tran Vy
(74) *Attorney, Agent, or Firm*—Stetina Brunda Garred & Brucker (57) ABSTRACT

A memory card comprising a circuit board having opposed upper and lower circuit board surfaces, at least one test pad disposed on the upper circuit board surface, and a conductive pattern disposed on the lower circuit board surface and electrically connected to the test pad. Electrically connected to the conductive pattern of the circuit board is a leadframe which includes a plurality of leads, each of the leads having a signal pad portion. At least one electronic circuit element is attached to the lower circuit board surface and electrically connected to the leadframe and to the conductive pattern of the circuit board. A body at least partially encapsulates the circuit board, the leadframe and the electronic circuit element such that the test pad of the circuit board is exposed in an upper body surface of the body, and the signal pad portions of the leads of the leadframe are exposed in a lower body surface of the body.

20 Claims, 9 Drawing Sheets

U.S. PATENT DOCUMENTS

| | | |
|---|---|---|
| 6,143,981 A | 11/2000 | Glenn |
| D445,096 S | 7/2001 | Wallace |
| D446,525 S | 8/2001 | Okamoto et al. |
| 6,376,283 B1 | 4/2002 | Chen |
| 6,384,472 B1 | 5/2002 | Huang |
| 6,462,273 B1 * | 10/2002 | Corisis et al. ............... 174/521 |
| 6,476,469 B2 | 11/2002 | Hung et al. |
| 6,545,332 B2 | 4/2003 | Huang |
| 6,603,196 B2 | 8/2003 | Lee et al. |
| 6,624,005 B1 | 9/2003 | Di Caprio et al. |
| 6,911,718 B1 * | 6/2005 | Alegre et al. ................ 257/666 |
| 6,965,159 B1 * | 11/2005 | Miks et al. .................. 257/676 |
| 6,998,702 B1 * | 2/2006 | Zwenger et al. ............ 257/679 |
| 2002/0140068 A1 | 10/2002 | Lee |

FOREIGN PATENT DOCUMENTS

| | | |
|---|---|---|
| JP | 7017175 | 1/1995 |
| JP | 8190615 | 7/1996 |
| JP | 10334205 | 12/1998 |
| KR | 199410938 | 5/1994 |
| KR | 199552621 | 12/1995 |

* cited by examiner

MEMORY CARD AND ITS MANUFACTURING METHOD

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

Field of the Invention

The present invention relates generally to memory cards, and more particularly to a memory card (e.g., a multi-media card (MMC)) which is uniquely configured to include one or more separate I/O pads specifically adapted for use in carrying out testing and/or programming processes for the card. The memory card of the present invention may also be configured such that certain metal features of a leadframe thereof are effectively covered by an outer memory card body or cap to prevent inadvertent damage to (e.g., scratching) or short circuiting with the host socket of an external device.

As is well known in the electronics industry, memory cards are being used in increasing numbers to provide memory storage and other electronic functions for devices such as digital cameras, MP3 players, cellular phones, and personal digital assistants. In this regard, memory cards are provided in various formats, including multi-media cards and secure digital cards.

Typically, memory cards comprise multiple integrated circuit devices or semiconductor dies which are interconnected using a circuit board substrate. Memory cards also include electrical contacts for providing an external interface to an insertion point or socket. These electrical contacts are typically exposed on the backside of the circuit board substrate, with the electrical connection to the dies being provided by vias which extend through the circuit board substrate.

In an effort to simplify the process steps needed to fabricate the memory card, there has been developed by Applicant a memory card wherein a leadframe assembly is used an alternative to the circuit board substrate, as described in Applicant's co-pending U.S. application Ser. No. 09/956,190 entitled LEAD-FRAME METHOD AND ASSEMBLY FOR INTERCONNECTING CIRCUITS WITHIN A CIRCUIT MODULE filed Sep. 19, 2001, the disclosure of which is incorporated herein by reference. As is described in Ser. No. 09/956,190, the leadframe and semiconductor die of the memory card are covered with an encapsulant which hardens into a cover or body of the memory card. The body is sized and configured to meet or achieve a "form factor" for the memory card. In the completed memory card, the contacts of the leadframe are exposed within a common surface of the body, with the die pad of the leadframe and the semiconductor die mounted thereto being disposed within or covered by the body.

Memory cards, including leadframe based memory cards, are subject to testing and programming processes after the completion of the manufacture thereof. However, such testing and programming is often a time consuming process. In this regard, leadframe based memory cards are often susceptible to a design constraint regarding the number of I/O pads that can be included in the leadframe and thus the completed memory card, i.e., the number of I/O pads that can be included in the memory card is limited due to the structure of the leadframe. Accordingly, in currently known leadframe based memory cards, it is typically necessary to perform the testing and programming processes using only a limited number of I/O pads. As a result, completing various tests such as whether various electronic circuit elements of the card are correctly connected to the leads, whether actions for memory writing, erasing and reading are successfully being implemented, and whether program storage is correctly occurring takes approximately three hundred to four hundred seconds per memory card in the testing phase. As a result, the production yield per memory card unit is relatively low, with the testing and programming processes being performed with low efficiency, thus increasing the per unit cost for the memory card. Attempts to manufacture leadframe based memory cards having an increased number of I/O pads, with one or more of such pads being adapted for carrying out the testing and programming processes, has proven to be extremely difficult due to the current structural limitations of the leadframe (e.g., limitations in the size and lead pitch of the leadframe), along with difficulties in removing such separate I/O pad(s) upon the completion of the manufacturing process for the memory card.

Another drawback associated with currently known leadframe based memory cards is the exposure of certain metal features of leadframe in the leading edge of the memory card. Memory cards, such as multi-media, cards are used by advancing the same into a host socket which includes a plurality of connector pins. Any metal features of the leadframe exposed in the leading edge of the memory card are thus initially advanced into the host socket, and give rise to a potential short against the metal features of the host socket. The exposed metal features of the leadframe also may potentially scratch or otherwise damage the host socket when the memory card is advanced thereinto.

The present invention addresses and overcomes the above-described deficiencies of currently known leadframe based memory cards by providing a memory card which is uniquely configured to include one or more separate I/O pads specifically adapted for use in carrying out testing and/or programming processes for the card. Thus, while possessing the advantages attendant to the inclusion of a leadframe, the memory card of the present invention allows for substantial increases in the efficiency by which the testing and programming processes may be completed in relation thereto. The memory card of the present invention, despite including a leadframe, may also be configured such that metal features of the leadframe which could otherwise short against or damage the metal features of the host socket into which the memory card is inserted are effectively covered by an outer memory card body or cap. These and other attributes of the present invention will be described in more detail below.

BRIEF SUMMARY OF THE INVENTION

In accordance with the present invention, there is provided a memory card, the contacts of which are defined by an internal leadframe of the card. In addition to the leadframe, the memory card of the present invention includes a circuit board element which is operatively interfaced to the leadframe. The circuit board of the memory card is uniquely configured to include one or more I/O pads which are specifically dedicated for use in relation to the completion of testing and programming processes on the fully formed memory card. These dedicated I/O pads of the memory card are themselves electrically connected to electronic circuit elements which are also electrically connected to each other and to the leadframe in a prescribed manner. Upon the completion of the testing and programming processes, the I/O pad(s) of the memory card dedicated to such functions are covered or shielded with another component of the card, thus concealing them from view in the completed memory card. In one embodiment of the present invention, the memory card may be configured such that certain metal features of the leadframe are effectively covered by an outer memory card body or cap to prevent inadvertent damage or short circuiting with the host socket of an external device.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1A:
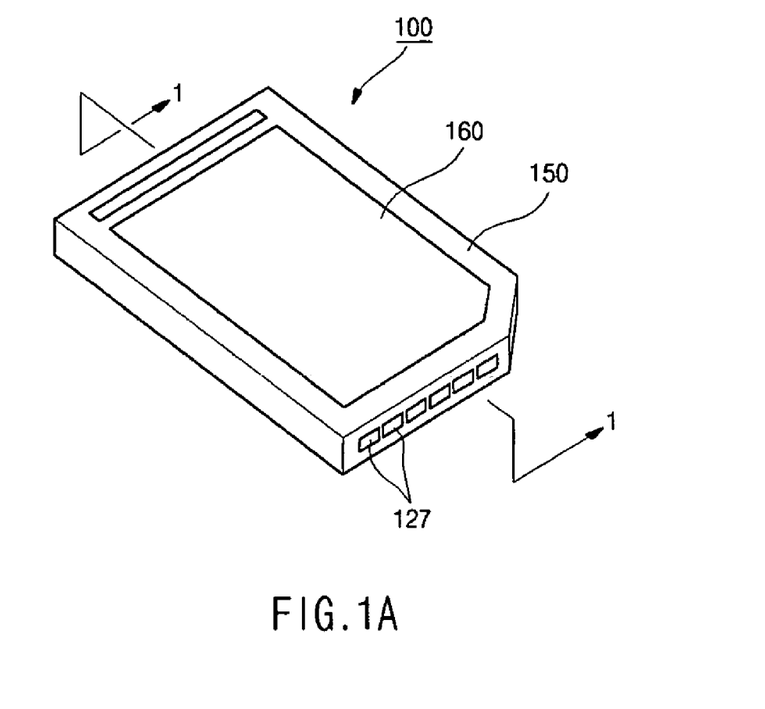
FIG. 1A is a top perspective view of a memory card constructed in accordance with a first embodiment of the present invention.
Figure 1B:
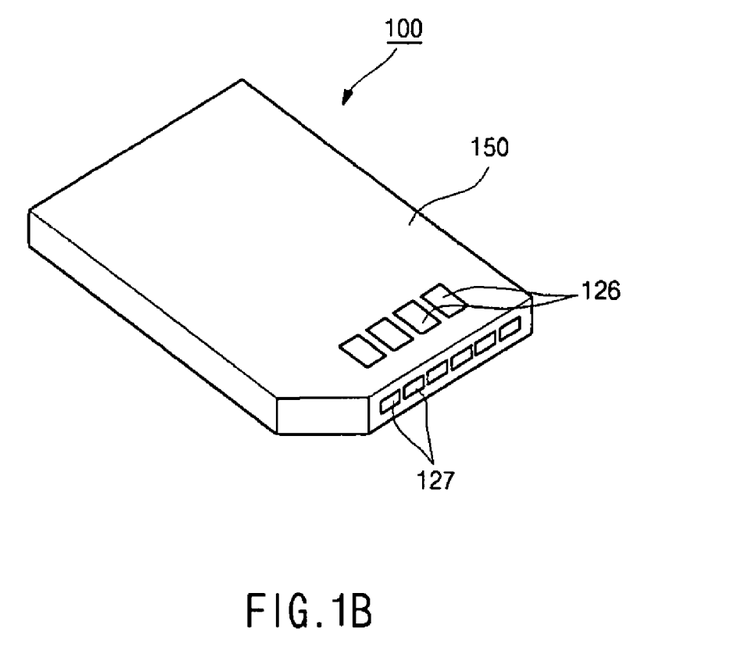
FIG. 1B is a bottom perspective view of the memory card shown in FIG. 1A.
Figure 1C:
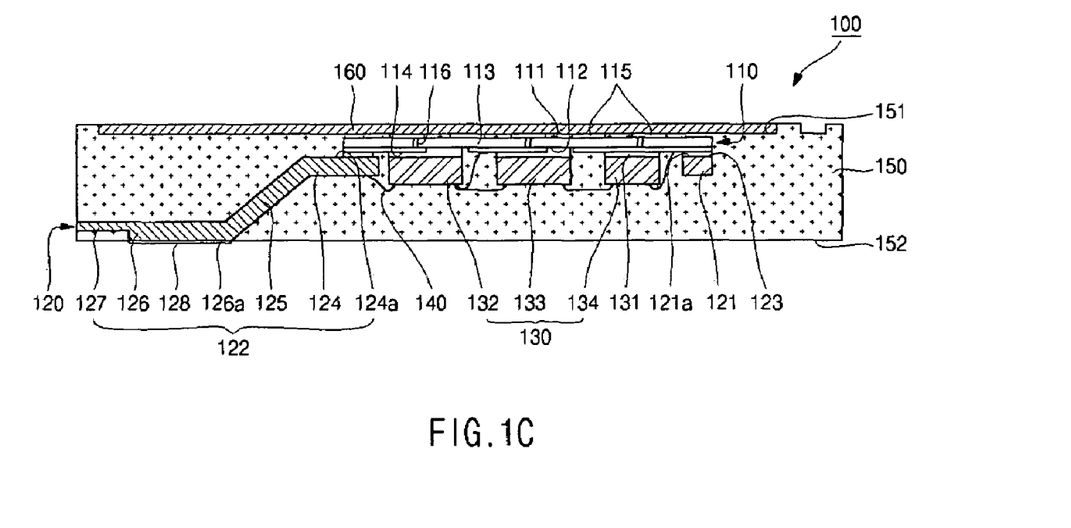
FIG. 1C is a cross-sectional view of the memory card of the first embodiment taken along line 1—1 of FIG. 1A.
Figure 1D:
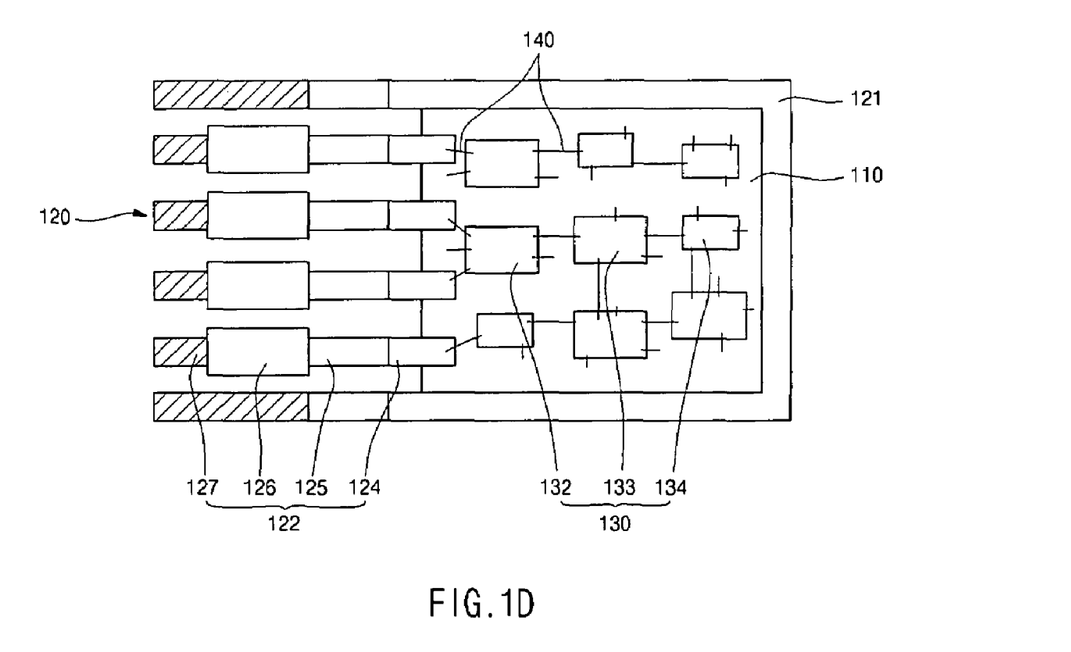
FIG. 1D is a bottom plan view of the memory card of the first embodiment with the encapsulant package body removed therefrom.

Referring now to the drawings wherein the showings are for purposes of illustrating preferred embodiments of the present invention only, and not for purposes of limiting the same, FIGS. 1A–1C depict a memory card 100 constructed in accordance with a first embodiment of the present invention. As is best seen in FIGS. 1C and 1D, the memory card 100 includes a circuit board 110 which has a generally quadrangular configuration. The circuit board 110 includes and insulative layer 113 which has a generally planar upper surface 111, and an opposed, generally planar lower surface 112. Formed on the lower surface 112 of insulative layer 113 is an electrically conductive pattern 114. Formed on the upper surface 11 of the insulative layer 113 are a plurality of test I/O pads 115. In the circuit board 110, the conductive pattern 114 is electrically connected to the I/O pads 115 by one or more conductive vias 116 which extend through the insulative layer 113. The circuit board 110, and in particular the insulative layer 113 thereof, may be a hardened printed circuit board, a flexible printed circuit board, or its equivalent, the present invention not being limited to any particular material for the insulative layer 113.

Figure 2A:
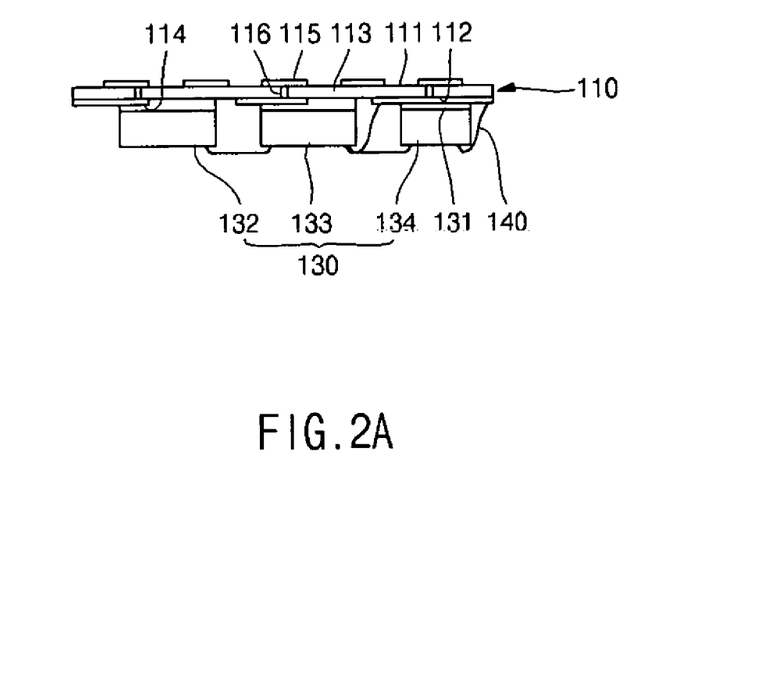
FIG. 2A is a side elevational view of the circuit board of the memory card of the first embodiment having the electronic circuit element mounted thereto.
Figure 2B:
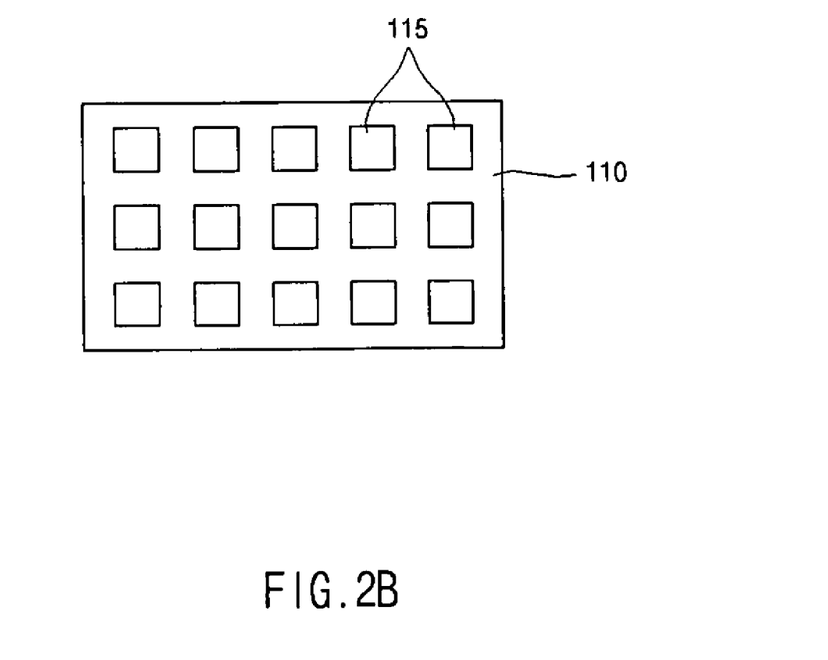
FIG. 2B is a top plan view of the circuit board shown in FIG. 2A.
Figure 2C:
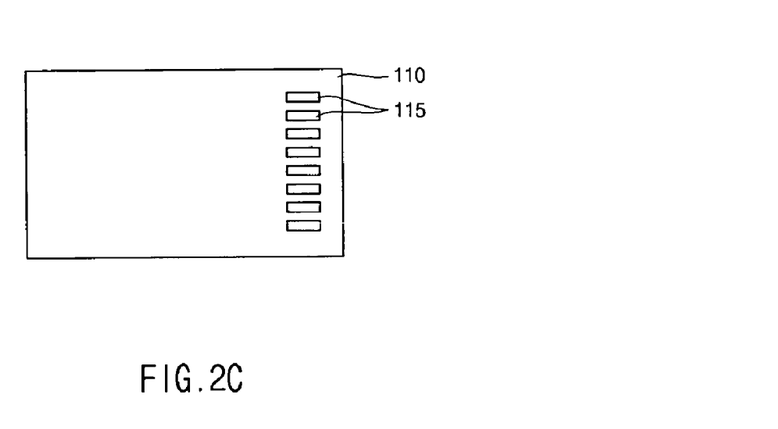
FIG. 2C is a top plan view of an alternatively configured circuit board which may be integrated into the memory card of the first embodiment.

Referring now to FIGS. 2A and 2B, it is comtemplated that each of the I/O pads 115 disposed on the upper surface 111 of the circuit board 110 may have a generally quadrangular (e.g., square) configuration. Additionally, the I/O pads 115 may arranged in a full array form, defining a plurality of rows and columns (FIG. 2B). However, in an alternative embodiment of the circuit board 110 shown in FIG. 2C, it is contemplated that test I/O pads 115 may be arranged in a partial array form wherein they are arranged in a single row which extends along one of the lateral peripheral edge segments of the insulative layer 113. However, those of ordinary skill in the art will recognize that the arrangement of the test I/O pads 115 as shown in FIGS. 2B and 2C is exemplary only, and that the I/O pads 115 may be included on the upper surface 111 of the insulative layer 113 in a multiplicity of different arrangements or patterns.

Figure 3A:
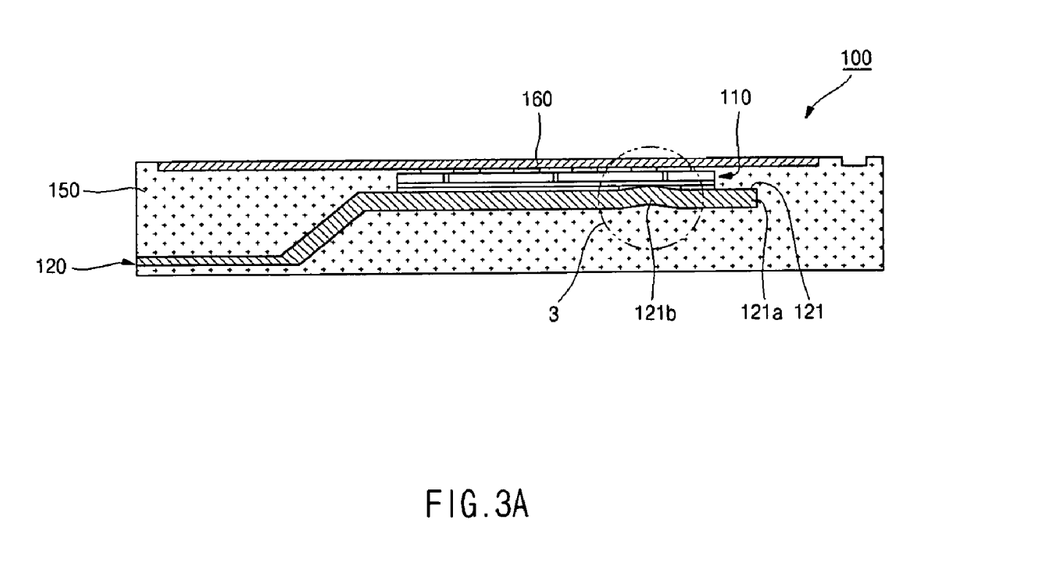
FIG. 3A is a cross-sectional view of the memory card of the first embodiment, illustrating the electrical connection between the leadframe and the circuit board of the memory card.
Figure 3B:
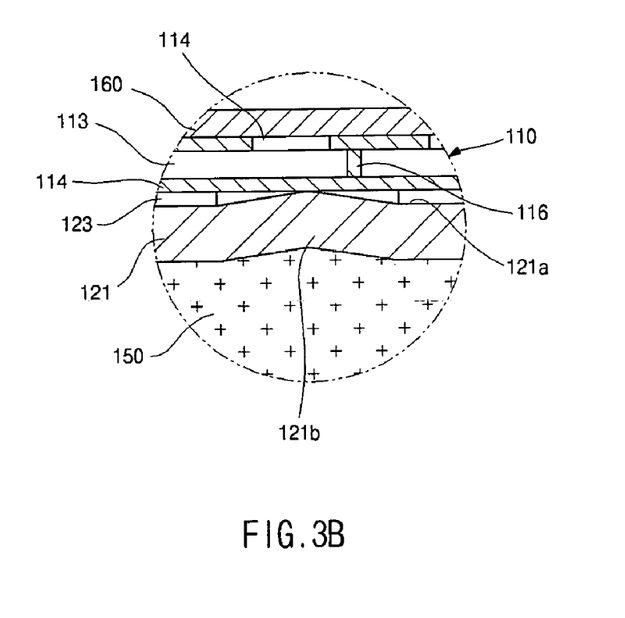
FIG. 3B is an enlargement of the encircled region 3 shown in FIG. 3A.

In addition to the circuit board 110, the memory card 100 includes a leadframe 120 which is disposed on and attached to the lower surface 112 of the insulative layer 113. The leadframe 120 is also electrically connected to the circuit board 110 in a manner which will be described in more detail below. As further seen in FIGS. 1C and 1D, the leadframe 120 includes a ground lead 121 which has a generally U-shaped configuration and includes a pair of partially etched distal end portions. The ground lead 121 is adhered to the lower surface 112 of the insulative layer 113 so as to extend along three of the four peripheral edge segments defined by the insulative layer 113. The attachment of the ground lead 121 of the leadframe 120 to the insulative layer 113 is facilitated by a layer of adhesive 123. As shown in FIGS. 3A and 3B, it is contemplated that the ground lead 121 will include at least one bent portion 121*b* at a predetermined section thereof. The bent portion 121*b* is bent upwardly and is electrically connected to the conductive pattern 114 formed on the lower surface 112 of the insulative layer 113 of the circuit board 110. As best seen in FIG. 3B, the adhesive 123 used to attach the leadframe 120 to the circuit board 110 is applied to the ground lead 121 such that no adhesive 123 is included between the bent portion 121*b* and the conductive pattern 114, thus allowing for the electrical contact between the bent portion 120*b* and such conductive pattern 114. The advantages achieved by the placement of the leadframe 120 into electrical communication with the circuit board 110 in the aforementioned manner will be discussed in more detail below.

In addition to the ground lead 121, the leadframe 120 includes multiple leads 122. Each of the leads 122 includes a bonding portion 124, a bent portion 125, a signal I/O pad portion 126, and a partially etched portion 127. The generally planar upper surface 124*a* of the bonding portion 124 of each lead 122 may be adhered to the lower surface 112 of the insulative layer 113 of the circuit board 110 through the use of an adhesive 131. The bent portion 125 of each lead 122 slopes downwardly from the corresponding bonding portion 124 at a predetermined angle and is of a predetermined length. The signal I/O pad portion 126 of each lead 122 defines a generally planar lower surface 126a and extends generally horizontally from the corresponding bent portion 125 (i.e., the lower surface 126a extends in spaced, generally parallel relation to the upper surface 124a of the corresponding bonding portion 124), and is also of a predetermined length. It is contemplated that the signal I/O pad portion 126 of each lead 122 may include a plating layer 128 which is applied to the lower surface 126a thereof to improve the electrical connection with an external device. The plating layer 128 of each lead 122 may be formed of a material having superior conductivity. Exemplary materials for the plating layers 128 include gold, silver or their equivalents, though the present invention is not limited to any particular material for the plating layers 128. The partially etched portion 127 of each lead 122 extends horizontally from the corresponding signal I/O pad portion 126, and is also of a predetermined length. In this regard, the generally planar upper surface of the partially etched portion 127 of each lead 122 is continuous with the generally planar upper surface of the corresponding signal I/O pad portion 126, with the lower surface of the partially etched portion 127 being vertically recessed or offset relative to the lower surface 126a of the corresponding signal I/O pad portion 126. The partially etched portion 127 of each lead 122 is used to increase the bonding force between the lead 122 and an encapsulant body of the memory card 100 in a manner which will be described in more detail below. The leadframe 120 of the memory card 100 is preferably fabricated from a conductive metal material (e.g., copper) through either a chemical etching or mechanical stamping process.

The memory card 100 of the first embodiment further comprises an electronic circuit element 130 which is attached to the lower surface 112 of the insulative layer 113 of the circuit board 110 through the use of an adhesive 131. The electronic circuit element 130 may comprise a semiconductor package 132, a semiconductor die 133, and a passive element 134. In the absence of the passive element 134, the semiconductor package 132 and/or the semiconductor device 133 may be adhered to the lower surface 112 of the insulative layer 113. In this regard, though the electronic circuit element 130 is shown in FIGS. 1C and 2A as including three components (the semiconductor package 132, semiconductor die 133 and passive element 134), those of ordinary skill in the art will recognize that this particular combination is illustrative only, in that the nature and number of the components included in the electronic circuit element 130 may be varied, and provided in a multiplicity of different combinations. In the configuration shown in FIG. 1C, conductive wires 140 are used to facilitate the electrical connection between the electronic circuit element 130 and the circuit board 110, between the electronic circuit element 130 and the leads 122 of the leadframe 120, between the electronic circuit element 130 and the ground lead 121 of the leadframe 120, and between the individual components of the electronic circuit element 130. More particularly, conductive wires 140 are advanced between the electronic circuit element 130 and the bonding portions 124 of the leads 122, and between the electronic circuit element 130 and the conductive pattern 114 formed on the lower surface 112 of the insulative layer 113 of the circuit board 110. Though not shown, those of ordinary skill in the art will recognize that a flip chip bonding method may be used as an alternative to conductive wires 140 to facilitate the electrical connection of the electronic circuit element 130 to the circuit board 110 and/or the leadframe 120. By virtue of the electrical connection between the bent portion 121b of the ground lead 121 and the circuit board 110, grounding treatment for the electronic circuit element 130, the circuit board 110, and the leads 122 may be facilitated, thereby improving the electrical performance of the electronic circuit element 130.

As seen in FIGS. 1A, 1B, 1C and 3A, the memory card 100 of the first embodiment further comprises an encapsulant body 150 which at least partially encapsulates the circuit board 110, the leadframe 120, the electronic circuit element 130 and the conductive wires 140 to protect the same from the external environment. In the memory card 100, the test I/O pads 115 of the circuit board 110 are exposed in the upper surface 151 of the body 150. In addition, the plating layer 128 formed on the lower surface 126a of the signal I/O pad portion 126 of each lead 122 is itself exposed in the lower surface 152 of the body 150. As a result, the signal I/O pads portions 126, and more particularly the plating layers 128 applied thereto, may be connected to an external device. Further, in the fully formed body 150, the distal ends of the partially etched portions 127 of the leads 122 and the distal ends of the partially etched distal end portions of the ground lead 121 are exposed in and substantially flush with a common side surface of the body 150. The encapsulant material used to form the body 150 may include, for example, an epoxy, a plastic molding compound, or equivalents thereto, the present invention not being limited to any specific material for the body 150. Subsequent to the formation of the body 150, it is contemplated that a label 160 will be attached to the upper surface 151 of the body 150 in a manner covering the exposed test I/O pads 115 of the circuit board 110, thus shielding them from view. As a result, the inclusion of the test I/O pads 115 in the memory card 100 does not adversely affect the appearance thereof.

Figure 5A:
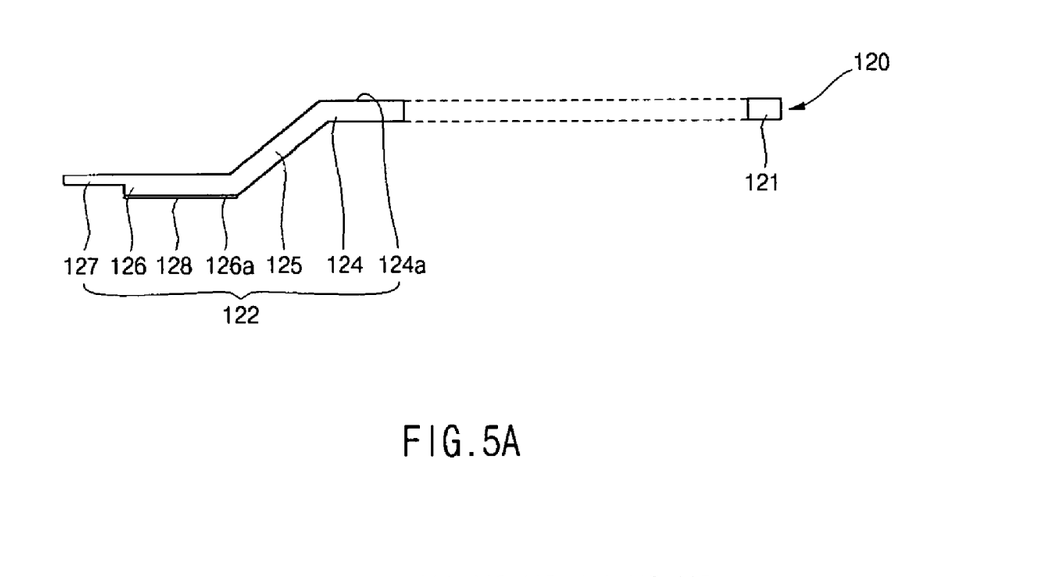
FIGS. 5A–5F illustrate an exemplary sequence of steps which may be used to facilitate the fabrication of the memory card of the first embodiment shown in FIGS. 1A–1D.
Figure 5B:
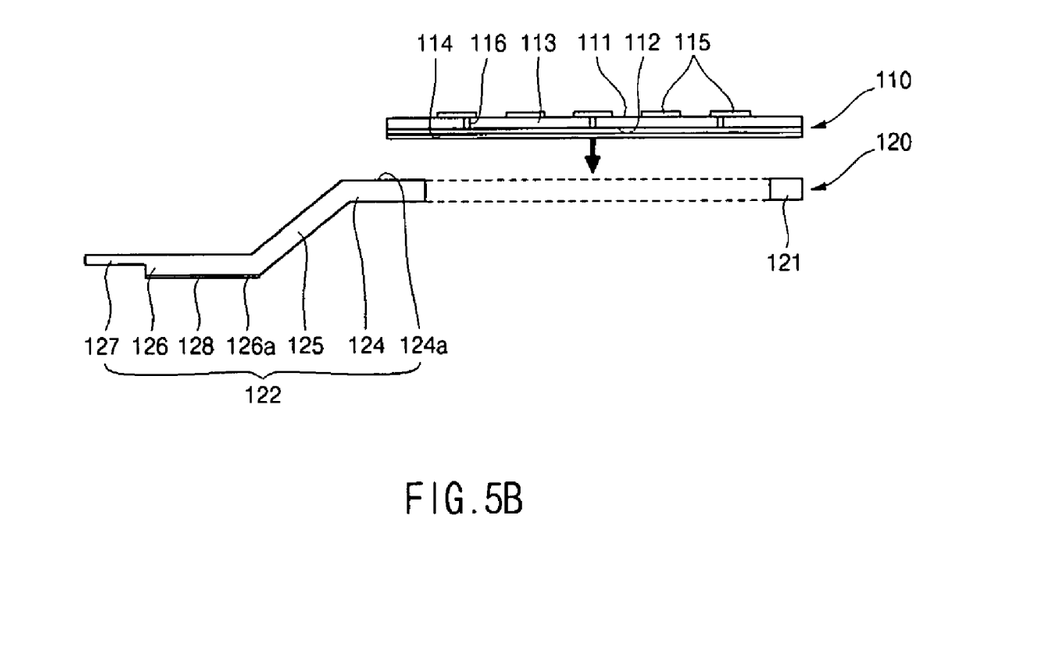

Referring now to FIGS. 5A–5F, there is shown an exemplary sequence of steps which may be used to facilitate the fabrication of the memory card 100 of the first embodiment of the present invention. In the initial step of the sequence, the above-described leadframe 120 is provided (FIG. 5A). The circuit board 110 is then adhered to the upper surface 121a of the ground lead 121 of the leadframe 120 in the above-described manner through the use of the adhesive 123 (FIG. 5B). As indicated above, it is contemplated that a predetermined section or area of the lower surface 112 of the insulative layer 113 of the circuit board 110 may be adhered to the upper surfaces 124a of one or more of the bonding parts 124 of the leads 122 through the use of adhesive 131. As also explained above, the attachment of the circuit board 110 to the leadframe 120 also will typically facilitate the electrical communication therebetween by virtue of the contact between the bent portion 121b of the ground lead 121 and the conductive pattern 114 of the circuit board 110.

Figure 5C:
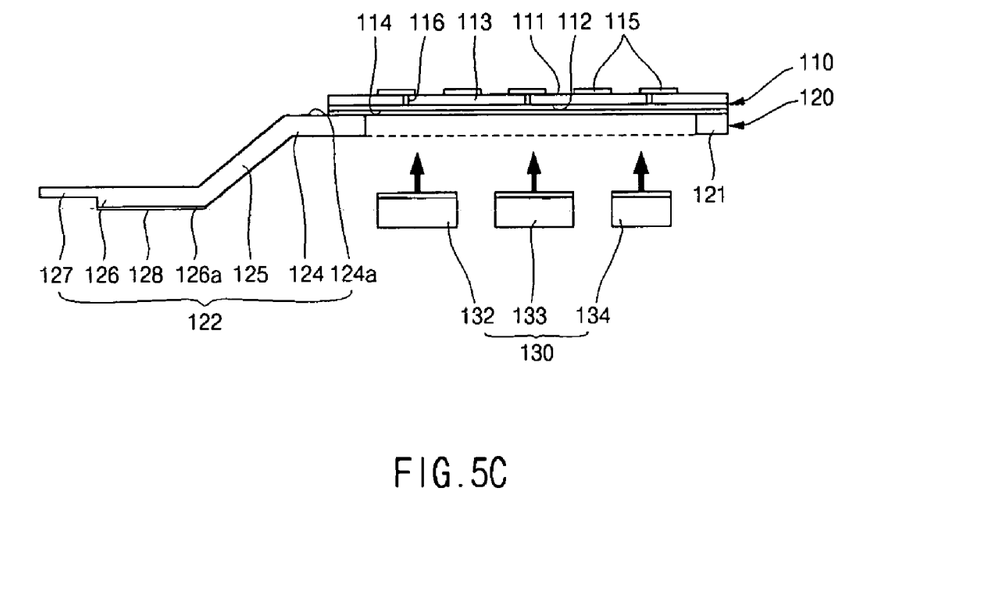
Figure 5D:
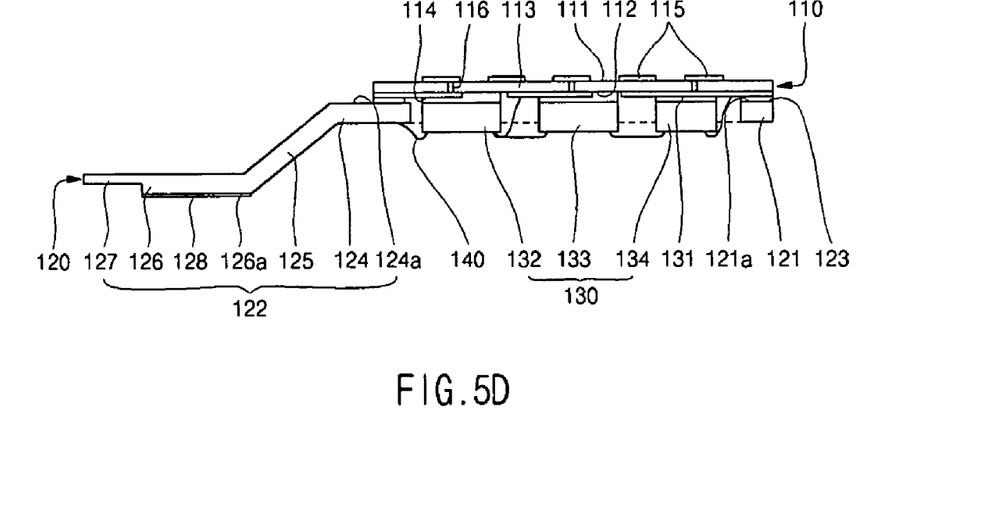
Figure 5E:
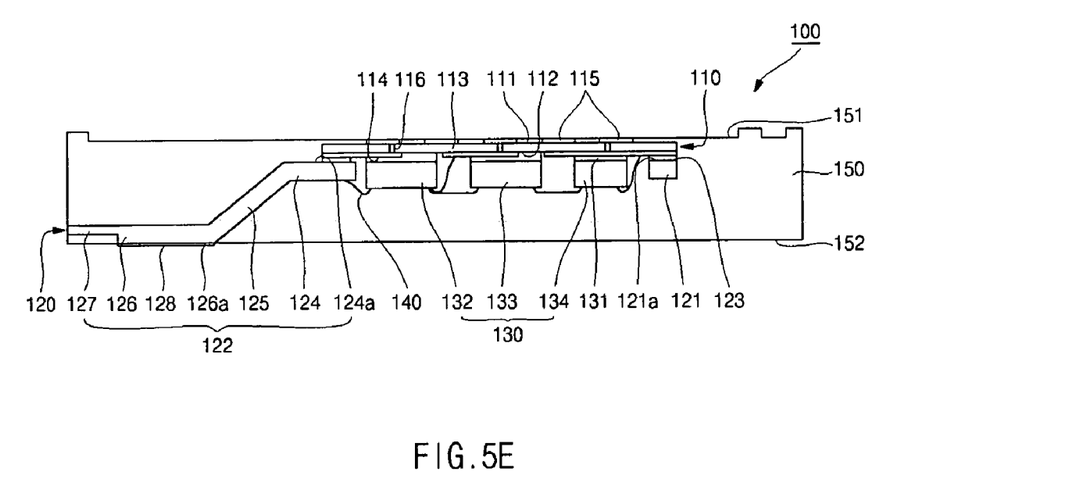
Figure 5F:
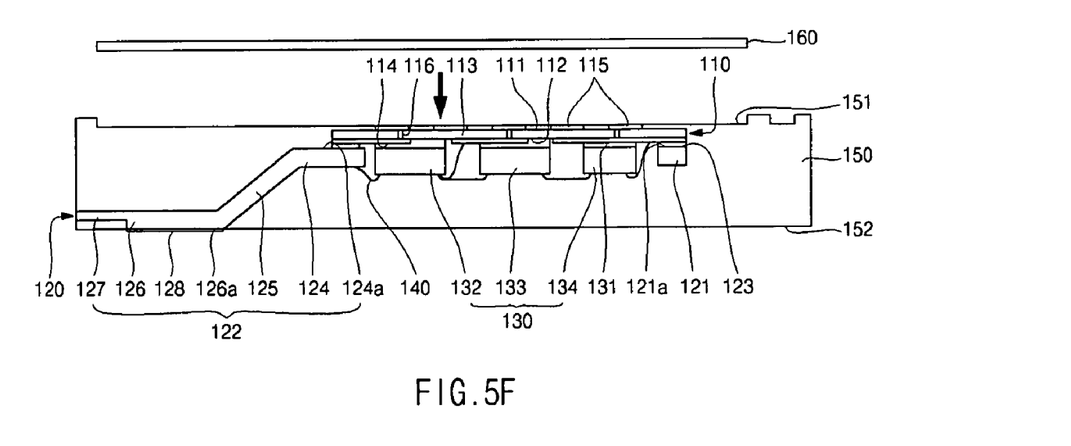

Subsequent to the attachment of the circuit board 110 to the leadframe 120, the electronic circuit element 130 is adhered to the lower surface 112 of the insulative layer 113 of the circuit board 110 through the use of the adhesive 131 (FIG. 5C). Thereafter, the bonding wires 140 are applied in a manner facilitating the electrical connection between the electronic circuit element 130 and the leads 122, between the electronic circuit element 130 and the circuit board 110, between the electronic circuit element 130 and the ground lead 121, and between the individual components of the electronic circuit element 130 (FIG. 5D). Those of ordinary skill in the art will also recognize that one or more conductive wires 140 may be used to facilitate the electrical connection between the circuit board 110 and the ground lead 121. The leadframe 120, the circuit board 110, the electronic circuit element 130 and the conductive wires 140 are then encapsulated with the body 150 in the above-described manner (FIG. 5E). As indicated above, the test I/O pads 115 of the circuit board 110 are exposed in the upper surface 151 of the body 150, with the plating layers 128 formed on the signal I/O pad portions 126 of the leads 122 being exposed in the lower surface 152 of the body 150. The recessed lower surfaces of the partially etched portions 127 of the leads 122 and the recessed lower surfaces of the partially etched distal end portions of the ground lead 121 are each covered by the body 150, thereby strengthening the mechanical interlock between the body 150 and the leads 121, 122. Thereafter, the testing and programming processes are typically performed using the test I/O pads 115. These processes are used to test the memory card electrically and to store desired programs necessary to facilitate desired memory functions. Advantageously, it takes only about 30 to 40 seconds per memory card 100 to perform the programming and testing processes due to the inclusion of the test I/O pads 115 therein. Upon the completion of the testing and programming processes, the label 160 is adhered to the body 150 in the above-described manner (FIG. 5F). As indicated above, the attachment of the label 160 to the body 150 effectively conceals the test I/O pads 115, thus not detracting from the appearance of the memory card 100.

In the sequence of steps used to facilitate the fabrication of the memory card 100, it is contemplated that the leadframe 120 may initially be provided in an unsignulated state wherein the partially etched portions 127 of the leads 122 and the partially etched end portions of the ground lead 121 are attached to a common dambar (not shown). The attachment of the leads 121, 122 to the common dambar maintains the same in their prescribed orientations relative to each other in the process of attaching the leadframe 120 and the circuit board 110 to each other. The body 150 is thereafter formed such that the dambar remains exposed, and is not covered thereby. Thus, upon the complete formation of the body 150, the dambar may be removed from the remainder of the leadframe 120 through the completion of a singulation or severing process. As a result of such singulation, the severed ends of the leads 121, 122 remain exposed in and substantially flush with a side surface of the body 150.

Figure 4:
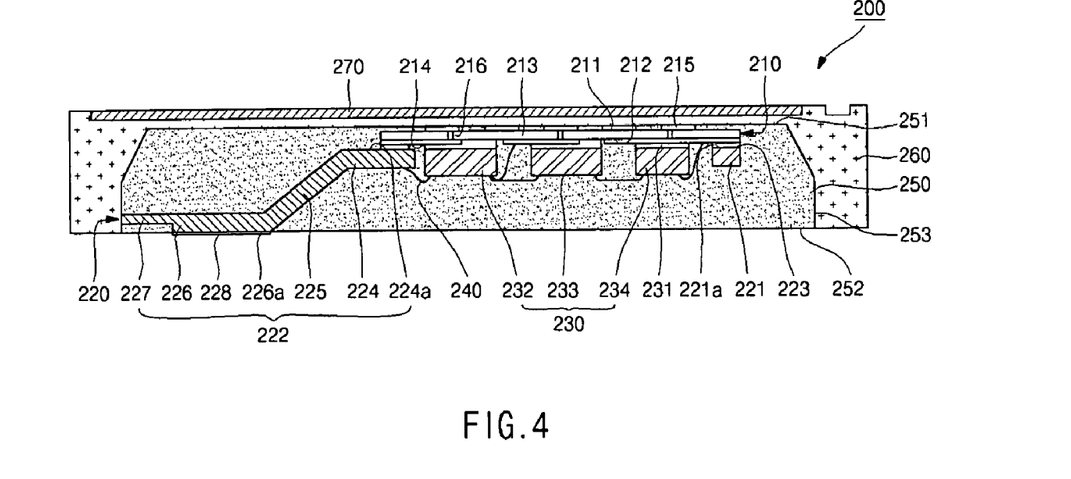
FIG. 4 is a cross-sectional view of a memory card constructed in accordance with a second embodiment of the present invention.

Referring now to FIG. 4, there is shown a memory card 200 constructed in accordance with a second embodiment of the present invention. The memory card 200 of the second embodiment bears substantially similarity in construction to the memory card 100 of the first embodiment, with the 200 series reference numerals in FIG. 4 being used to identify the same structures identified by the corresponding 100 series reference numerals included in FIGS. 1A–1D. In this regard, only the distinctions between the memory cards 200, 100 will be discussed below.

The memory card 200 differs from the memory card 100 in that the memory card 200 further includes an outer body or cap 260 which is coupled to the upper surface 251 and a side surface 253 of the body 250. As a result, the test I/O pads 215 of the circuit board 210 are not exposed to the exterior due to the same being effectively covered by the cap 260. Additionally, the distal ends of the partially etched portions 227 of the leads 222 and the distal ends of the partially etched distal end portions of the ground lead 221 which are exposed in the side surface 253 of the body 250 are covered by the cap 260, thus preventing inadvertent damage to or shorting with an external device into which the memory card 200 is advanced. In the memory card 200, a label 270 may be adhered to the cap 260.

Figure 6A:
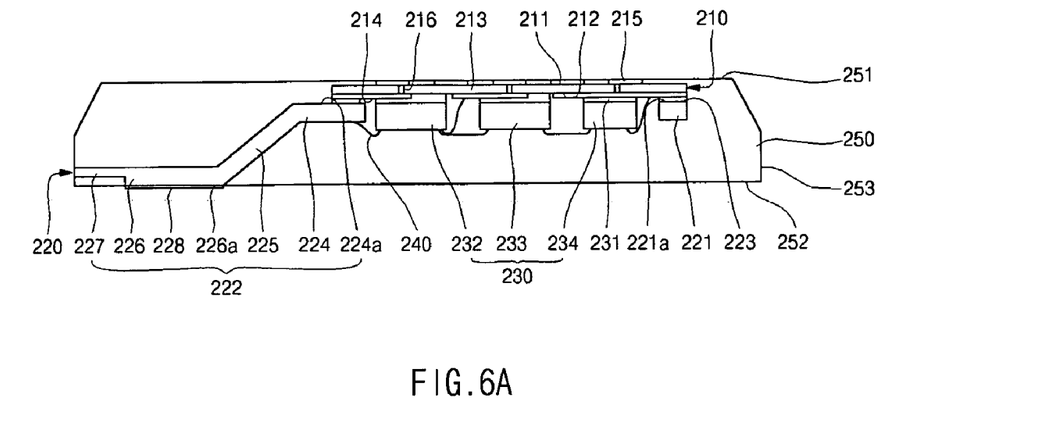
FIGS. 6A–6B illustrate an exemplary sequence of steps which may be used to facilitate the fabrication of the memory card of the second embodiment shown in FIG. 4.
Figure 6B:
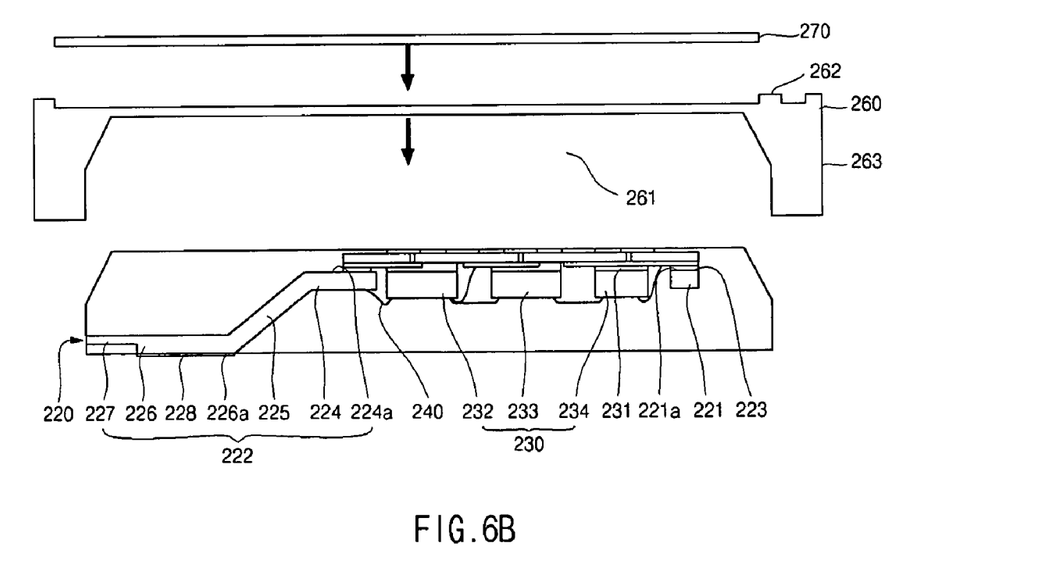

Referring now to FIGS. 6A and 6B, there is shown an exemplary sequence of steps which may be used to facilitate the fabrication of the memory card 200 of the second embodiment of the present invention. The method for forming the memory card 200 is identical to that described above in relation to FIGS. 5A–5F regarding the steps for fabricating the memory card 100 of the first embodiment. Upon the completion of the testing and programming processes on the memory card 200, the cap 260 is attached to the body 250 in a manner covering the upper surface 251 and side surface 253 thereof. The cap 260 itself defines an upper surface 262 and a side surface 263, and is attached to the body 250 in a manner effectively covering and concealing the test I/O pads 215. As indicated above, the cap 260 also effectively covers and conceals the distal end portions of the partially etched portions 227 of the leads 222 and the distal ends of the partially etched distal end portions of the ground lead 221 which are exposed in the side surface 253 of the body 250.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A memory card, comprising:
   a circuit board having opposed upper and lower circuit board surfaces, at least one test pad disposed on the upper circuit board surface, and a conductive pattern which is disposed on the lower circuit board surface and electrically connected to the test pad;
   a leadframe attached to the lower circuit board surface and including a plurality of leads which each have a signal pad portion;
   at least one electronic circuit element attached to the lower circuit board surface and electrically connected to the leadframe and to the conductive pattern; and
   a body at least partially encapsulating the circuit board, the electronic circuit element and the leadframe such that the test pad of the circuit board is exposed in an upper body surface of the body, and the signal pad portions of the leads are exposed in a lower body surface of the body.

2. The memory card of claim 1 wherein the leadframe further comprises a ground lead which is electrically connected to the conductive pattern of the circuit board.

3. The memory card of claim 2 wherein the ground lead of the leadframe includes a bent portion which is disposed in electrical contact with the conductive pattern of the circuit board.

4. The memory card of claim 1 wherein the electronic circuit element is electrically connected to at least one of the leads via at least one conductive wire which is covered by the body.

5. The memory card of claim 4 wherein:
   each of the leads further includes a bonding portion which is attached to the lower circuit board surface of the circuit board; and
   the electronic circuit element is electrically connected to each of the leads via conductive wires which extend from the electronic circuit element to respective ones of the bonding portions thereof.

6. The memory card of claim 5 wherein:
the bonding portion of each of the leads includes a generally planar upper bonding portion surface which is attached to the lower circuit board surface;
the signal pad portion of each of the leads includes a generally planar lower signal pad surface; and
the lower signal pad surfaces and the upper bonding portion surfaces extend along respective ones of a spaced, generally parallel pair of planes.

7. The memory card of claim 6 wherein each of the leads further comprises a sloped portion which extends at a prescribed angle between the bonding portion and the signal pad portion thereof.

8. The memory card of claim 7 wherein each of the leads further comprises a partially etched portion which extends from the signal pad portion and includes a lower partially etched portion surface which is recessed relative to the lower signal pad surface and is covered by the body.

9. The memory card of claim 1 wherein:
the signal pad portion of each of the leads defines a generally planar lower signal pad surface; and
the lower signal pad surface of each of the leads includes a plating layer which is disposed thereon and exposed in the lower body surface of the body.

10. The memory card of claim 1 wherein a plurality of test pads are disposed on the upper circuit board surface of the circuit board and exposed in the upper body surface of the body.

11. The memory card of claim 10 wherein the test pads are arranged in multiple rows and columns.

12. The memory card of claim 10 wherein the circuit board defines multiple peripheral edge segments, and the test pads are arranged in a single row which extends along one of the peripheral edge segments of the circuit board.

13. The memory card of claim 1 wherein the electronic circuit element is selected from the group consisting of:
a semiconductor package;
a semiconductor die;
a passive element; and
combinations thereof.

14. A memory card, comprising:
a circuit board having opposed upper and lower circuit board surfaces, and a plurality of test pads disposed on the upper circuit board surface;
a leadframe attached to the lower circuit board surface and including a plurality of leads which each have a signal pad portion;
at least one electronic circuit element attached to the lower circuit board surface and electrically connected to the leadframe and to the test pads;
a body at least partially encapsulating the circuit board, the electronic circuit element and leadframe such that the test pads of the circuit board are exposed in an upper body surface of the body, the signal pad portions of the leads are exposed in a lower body surface of the body, and distal ends of the leads are exposed in a side surface of the body; and
a cap attached to the body in a manner covering the exposed test pads and the exposed distal ends of the leads.

15. The memory card of claim 14 wherein:
the circuit board includes a conductive pattern which is disposed on the lower circuit board surface and electrically connected to the test pads;
the electronic circuit element is electrically connected to the conductive pattern; and
the leadframe further comprises a ground lead which is electrically connected to the conductive pattern.

16. The memory card of claim 15 wherein the ground lead of the leadframe includes a bent portion which is disposed in electrical contact with the conductive pattern of the circuit board.

17. The memory card of claim 14 wherein:
each of the leads further includes a bonding portion which is attached to the lower circuit board surface of the circuit board; and
the electronic circuit element is electrically connected to each of the leads via conductive wires which extend from the electronic circuit element to respective ones of the bonding portions thereof.

18. The memory card of claim 17 wherein:
the bonding portion of each of the leads includes a generally planar upper bonding portion surface which is attached to the lower circuit board surface;
the signal pad portion of each of the leads includes a generally planar lower signal pad surface; and
the lower signal pad surfaces and the upper bonding portion surfaces extend along respective ones of a spaced, generally parallel pair of planes.

19. The memory card of claim 18 wherein each of the leads further comprises a sloped portion which extends at a prescribed angle between the bonding portion and the signal pad portion thereof.

20. The memory card of claim 19 wherein each of the leads further comprises a partially etched portion which extends from the signal pad portion and includes a lower partially etched portion surface which is recessed relative to the lower signal pad surface and is covered by the body.

* * * * *